(12) United States Patent
Motta et al.

(10) Patent No.: US 12,101,106 B2
(45) Date of Patent: Sep. 24, 2024

(54) COMPRESSION OF DATA THAT EXHIBITS MIXED COMPRESSIBILITY

(71) Applicant: Google LLC, Mountain View, CA (US)

(72) Inventors: Giovanni Motta, San Jose, CA (US); Francoise Beaufays, Mountain View, CA (US); Petr Zadrazil, San Mateo, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 18/496,120

(22) Filed: Oct. 27, 2023

(65) Prior Publication Data
US 2024/0080038 A1 Mar. 7, 2024

Related U.S. Application Data

(63) Continuation of application No. 17/620,448, filed as application No. PCT/US2019/050205 on Sep. 9, 2019, now Pat. No. 11,843,397.

(51) Int. Cl.
H03M 7/30 (2006.01)
G06F 7/483 (2006.01)
G06F 7/74 (2006.01)
G06N 3/10 (2006.01)
H03M 7/24 (2006.01)

(52) U.S. Cl.
CPC ............ *H03M 7/30* (2013.01); *G06F 7/483* (2013.01); *G06F 7/74* (2013.01); *G06N 3/10* (2013.01); *H03M 7/24* (2013.01)

(58) Field of Classification Search
CPC .......... H03M 7/30; H03M 7/24; G06F 7/483; G06F 7/74; G06N 3/10
See application file for complete search history.

(56) References Cited

U.S. PATENT DOCUMENTS

2014/0321555 A1* 10/2014 Rossato ................ H04N 19/46
375/240.26

FOREIGN PATENT DOCUMENTS

EP 3298695 3/2018

OTHER PUBLICATIONS

Arelakis et al., "HyComp: A Hybrid Cache Compression Method for Selection of Data-Type-Specific Compression Methods", MICRO-48: Proceedings of the 48th International Symposium on Microarchitecture, Dec. 5-9, 2015, Waikiki, Hawaii, pp. 38-49.
Guo et al., "Exploration of Automatic Mixed-Precision Search for Deep Neural Networks", 2019 IEEE International Conference on Artificial Intelligence Circuits and Systems (AICAS), Mar. 18-20, 2019, Hsinchu, Taiwan, pp. 276-278.
(Continued)

*Primary Examiner* — Joseph J Lauture
(74) *Attorney, Agent, or Firm* — DORITY & MANNING P.A.

(57) ABSTRACT

Systems and methods for compression of data that exhibits mixed compressibility, such as floating-point data, are provided. As one example, aspects of the present disclosure can be used to compress floating-point data that represents the values of parameters of a machine-learned model. Therefore, aspects of the present disclosure can be used to compress machine-learned models (e.g., for reducing storage requirements associated with the model, reducing the bandwidth expended to transmit the model, etc.).

20 Claims, 7 Drawing Sheets

(56) References Cited

OTHER PUBLICATIONS

Hsu et al., "A Study on Speech Enhancement Using Exponent-Only Floating Point Quantized Neural Network (EOFP-QNN)", 2018 IEEE Spoken Language Technology Workshop (SLT), Dec. 18-21, 2018, Athens, Greece, pp. 566-573.
International Preliminary Report on Patentability for Application No. PCT/US2019/050205, mailed Mar. 17, 2022, 11 pages.
Lindstrom et al., "Fast and Efficient Compression of Floating-Point Data", IEEE Transactions on Visualization and Computer Graphics, vol. 12, No. 5, 2006, pp. 1245-1250.
Lyubarskii et al., "Uncertainty principles and vector quantization", arXiv:math/0611343v2, 14 pages.
Ratanaworabhan et al., "Fast Lossless Compression of Scientific Floating-Point Data", Data Compression Conference (DCC'06), Mar. 28-30, 2006, Snowbird, Utah, pp. 133-142.
Wikipedia, "Quantization (signal processing)", https://en.wikipedia.org/wiki/Quantization_(signal_processing), retrieved on May 22, 2018, 14 pages.

\* cited by examiner

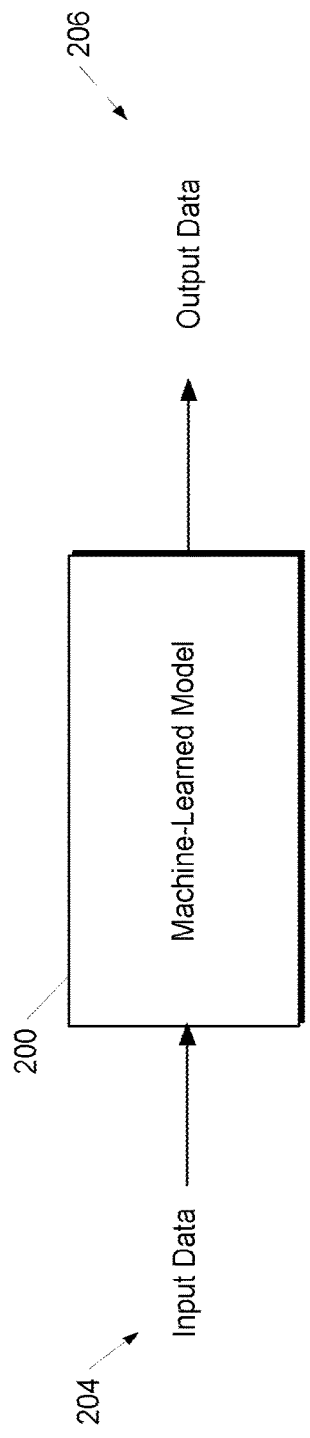
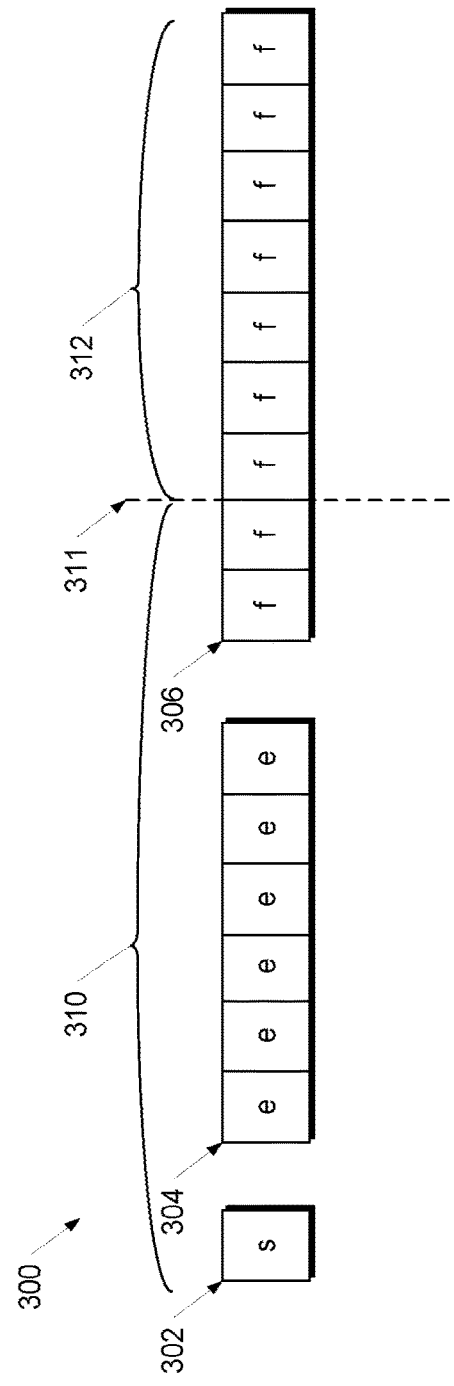

COMPRESSION OF DATA THAT EXHIBITS MIXED COMPRESSIBILITY

RELATED APPLICATIONS

This application is a continuation of U.S. patent application Ser. No. 17/620,448, filed Dec. 17, 2021, which is based upon and claims the right of priority under 35 U.S.C. § 371 to International Application No. PCT/US2019/050205, filed on Sep. 9, 2019. Applicant claims priority to and the benefit of each of such applications and incorporates all such applications herein by reference in their entirety.

FIELD

The present disclosure relates generally to systems and methods for compression of data that exhibits mixed compressibility. In particular, the present disclosure relates to compression of floating-point data such as, for example, floating-point data that encodes machine-learned model parameter values.

BACKGROUND

Information stored in computing systems can be stored as data in memory. For example, information can be stored as "bits" of data, where each bit equals 1 or 0.

It can be desirable to reduce the amount of data and/or memory used to store information (e.g., reduce the number of bits required to store the data). Techniques for reducing memory usage to store information are often referred to as compression techniques.

Lossless compression refers to compression techniques that allow an exact recreation of the information to be obtained after compression. Lossy compression refers to compression techniques that allow for only an approximation of the information to be recreated after compression.

In some situations, data may exhibit mixed compressibility. For example, a first portion of the data may be highly amenable to one or more compression techniques (i.e., may have high "compressibility") while a second portion may not be amenable to compression techniques (i.e., may have low "compressibility").

For example, data may have high compressibility if application of a compression technique results in significant reduction in memory and/or only zero or small amounts of information loss. However, data may have low compressibility if application of a compression technique results in only small amounts of memory reduction and/or large amounts of information loss.

SUMMARY

Aspects and advantages of embodiments of the present disclosure will be set forth in part in the following description, or can be learned from the description, or can be learned through practice of the embodiments.

One example aspect of the present disclosure is directed to a computing system configured to compress data. The computing system includes one or more processors and one or more non-transitory computer-readable media that store instructions that, when executed by the one or more processors, cause the computing system to perform operations. The operations include obtaining subject data. The operations include performing a first compression technique to compress a first portion of the data and obtain first compressed data, wherein a second portion of the data remains uncompressed following performance of the first compression technique. The operations include transforming the second portion of the data to obtain transformed data. The operations include quantizing the transformed data to obtain quantized data. The operations include storing the first compressed data and the quantized data.

Another example aspect of the present disclosure is directed to a computer-implemented method of transmitting compressed data. The method includes receiving, at a first computing device, subject data. The method includes determining, by the first computing device, a first portion and a second portion of the subject data. The method includes transforming, by the first computing device, the second portion to obtain transformed data. The method includes quantizing, by the first computing device, the transformed data to obtain quantized data. The method includes transmitting the quantized data from the first computing device to a second computing device.

Another example aspect of the present disclosure is directed to one or more non-transitory computer-readable media that store instructions that, when executed by one or more computing devices, cause the one or more computing devices to compress a machine-learned model by performing operations. The operations include obtaining model parameter data that comprises a plurality of floating-point numbers respectively for a plurality of parameters of the machine-learned model, wherein each of the plurality of floating-point numbers comprises one or more sign bits, a plurality of exponent bits, and a plurality of mantissa bits. The operations include, for each of the plurality of floating-point numbers: generating first compressed data from the one or more sign bits, the plurality of exponent bits, and one or more most significant mantissa bits of the plurality of mantissa bits to obtain first compressed data; performing a Kashin Decomposition on one or more remaining least significant mantissa bits to obtain transformed data, the one or more remaining least significant mantissa bits comprising the plurality of mantissa bits which were excluded from the one or more most significant mantissa bits from which the first compressed data was generated; performing uniform quantization on the transformed data to obtain quantized data; and storing the first compressed data and the quantized data.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which:

FIG. 2 depicts a block diagram of an example machine-learned model according to example embodiments of the present disclosure.

FIG. 3 depicts example a block diagram of example data according to example embodiments of the present disclosure.

Figure 1A:
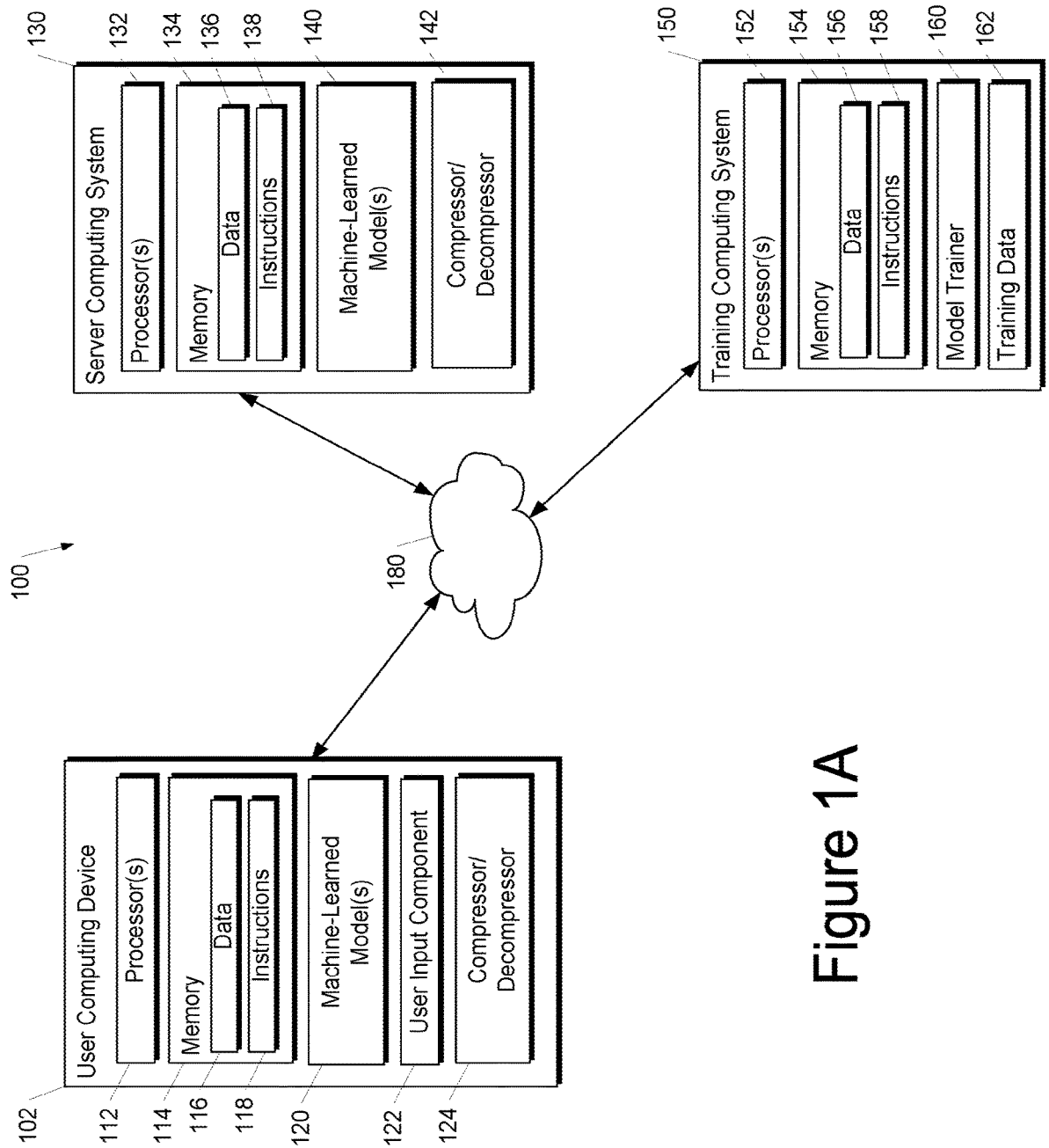
FIG. 1A depicts a block diagram of an example computing system according to example embodiments of the present disclosure.

Reference numerals that are repeated across plural figures are intended to identify the same features in various implementations.

DETAILED DESCRIPTION

Overview

Generally, the present disclosure is directed to systems and methods for compression of data that exhibits mixed compressibility, such as floating-point data. As one example, aspects of the present disclosure can be used to compress floating-point data that represents the values of parameters of a machine-learned model. Therefore, aspects of the present disclosure can be used to compress machine-learned models (e.g., for reducing storage requirements associated with the model, reducing the bandwidth expended to transmit the model, etc.). In particular, one aspect of the present disclosure is directed to a compression technique in which a first portion of the floating-point data that exhibits high compressibility is compressed using a predictive technique while a second, remaining portion of the floating-point data that exhibits low compressibility is compressed through decomposition (e.g., application of a Kashin Decomposition) in combination with quantization (e.g., uniform quantization, bit truncation, etc.).

More particularly, information can be stored in a computing system as data. Data can represent lexical, numerical, or other suitable types of information in a format that is capable of being processed and/or otherwise interpreted by a computing system. For example, data can be represented as a collection of numerals (e.g., bits) in a memory device. Example memory devices include, but are not limited to, non-transitory computer-readable storage mediums, such as RAM, ROM, EEPROM, EPROM, flash memory devices, magnetic disks, etc., and combinations thereof.

It can be desirable to reduce the amount of memory used to store the information. For instance, it can be desirable to reduce the size of the data used to store the information. Techniques for reducing the size of data are referred to as data compression techniques. Lossless compression refers to compression techniques that allow data to be compressed and subsequently decompressed with no loss of information. Lossy compression refers to compression techniques that introduce unrecoverable error into the data after compression and/or decompression, resulting in information loss. For example, lossy compression techniques can slightly increase and/or decrease numerical values represented by the data. As another example, lossy compression techniques can result in a loss in precision associated with the data. As another example, lossy compression techniques can introduce blur or other distortion into an image.

Although it can be desirable to reduce or eliminate information loss, lossy compression can allow for a significant decrease in the size of the data compared to lossless compression, such that some applications can opt to use lossy compression over lossless compression. For example, in many cases the error introduced by lossy compression does not significantly impact a function of the data.

It can be desirable to use compression techniques to store and/or transmit a data set having a large size, such as a data set having a large number of data items and/or a large number of numerals per data item. As one example, machine-learned models can be represented using tensors having a large number of model parameter values, such as respective values for millions of model parameters. Stated differently, parameters of machine-learned models can be represented as tensors having a large number (millions) of component values.

As another example, measurement data, such as time-series measurement data, can have a large number of samples. Time-series measurement data can include sensor data such as environmental sensor data (e.g., seismographic data, temperature data, etc.), biological sensor data, and/or any other data collected over time. Additionally, in many instances, the model parameters and/or measurement data can be represented in the form of floating-point data, which can require a relatively large amount of data to store. For example, in some cases, each item (e.g., each floating-point number) in a collection of floating-point data can be 32, 64, or 128 bits, which can contribute significantly to the size of the data.

Additionally, in some cases, a significant portion of the data can exhibit low compressibility. For example, low compressibility data can exhibit limited to no statistical redundancy across the data set, such that lossless compression techniques do not significantly reduce the size of the data. In the remainder of the present disclosure, the term "uncompressible" is used to generally refer to data having low compressibility. The term does not necessarily mean that the data cannot be compressed at all, but instead is used to refer to data that is not amenable to conventional compression techniques and/or data for which conventional compression techniques do not provide a satisfactory tradeoff among computational expenditure, information loss, and compression gains. As one example, data can be uncompressible if it experiences a decrease in size of less than a threshold amount (e.g., 10%) when compressed according to conventional compression methods.

As an example, floating-point data can be defined by a sign component, an exponent component, and a mantissa component (also called a significand component). In some cases, the sign component, exponent component, and/or a small portion of the mantissa component (e.g., about one to about three bits or numerals) can have some statistical redundancy across the data set, allowing them to be compressed efficiently according to lossless compression techniques. However, in some cases, the bulk of the mantissa component can be uncompressible. In cases where the mantissa component is the largest component in the floating-point data, this can especially limit the effectiveness of lossless compression techniques. For example, in some cases, the mantissa component can have a size of about 75% to about 80% of the total size of the floating-point data.

Similarly, in some cases, the size of a portion of the data that is uncompressible can be about 75% to about 80% of the total size of the data.

One solution to this problem is to quantize at least a portion of the data. For example, quantization techniques can map a set of values to an "index" in the compression phase and the index to a representative numerical value for the whole set in the decompression phase. Through performance of such process, precision can be removed because an entire set of values is mapped to a single element (e.g., via the index). Thus, quantization techniques can reduce a size of data by reducing precision of the data (e.g., by removing lower significance numerals from the data and truncating or rounding to the nearest lower-precision value) at the cost of losing any information at the original precision. This can introduce error into the data, which can adversely impact functions of systems utilizing the data. This problem can be especially worsened by the fact that the error introduced by quantization may not affect each data item in the data evenly. For example, if the data includes parameters defining a machine-learned model, some of the parameters can be more affected by the error than some other parameters, which can negatively impact training and/or prediction tasks of the machine-learned model.

Systems and methods according to example aspects of the present disclosure can provide a technical solution to these and other problems. According to example aspects of the present disclosure, one or more computing devices can receive subject data such as a data set. The data set can include a plurality of data items. For instance, each of the data items can define a value, such as a lexical and/or numerical value. The data can be stored according to any suitable format. For example, the data can be stored as one or more tensors. For example, each component in the one or more tensors can correspond to a data item in the plurality of data items.

The subject data can be stored in any suitable manner in accordance with example aspects of the present disclosure. For example, the data can be stored in any suitable memory device, such as one or more non-transitory computer-readable storage mediums, such as RAM, ROM, EEPROM, EPROM, flash memory devices, magnetic disks, etc., and combinations thereof.

In some embodiments, the data can include one or more numerals. For instance, each of the one or more data items can include one or more numerals. For example, the one or more numerals can include one or more bits. In some embodiments, the one or bits can represent computer-readable information. For example, the bits can encode information (e.g., numerical information such as base-10 numerical information, lexical information, or any other suitable information) as a string of binary data (e.g., base-2 numerical data) such that the information can be processed or otherwise interpreted by a computing system.

In some embodiments, the subject data can be floating-point data. For instance, the data can be representative of floating-point numbers. For example, the data can be defined and/or interpreted according to a floating-point standard, such as, but not limited to, IEEE 754. For example, the floating-point standard can define value of a real number according to:

$$\text{value} = (-1)^s \times b^{(e-o)} \times \left(1 + \sum_{i=1}^{p} m_{p-i} \times b^{-i}\right)$$

where s is the value of a sign component, b is a base value, e is the value of an exponent component, o is an offset value, p is a precision value, and $m_i$ is the value of the $i^{th}$ numeral of a mantissa component.

In some embodiments, the floating-point standard can define a base or radix. The base can represent the number of values representable by a single numeral. For example, the base can be two for binary representations or ten for decimal representations. Additionally and/or alternatively, the floating-point standard can define a precision. For example, the precision can define the maximum number of numerals for the mantissa component. Additionally and/or alternatively, the floating-point standard can define an exponent range. The exponent range can define a set of allowable values for an exponent component of the floating-point data. Additionally and/or alternatively, the exponent range can define a bias or offset and/or a number of numerals for the exponent component. Additionally and/or alternatively, the floating-point standard can define one or more reserved values. For example, the reserved values can represent special cases or other exceptions to the format, such as, but not limited to, infinite or representationally infinite values (e.g., infinity, negative infinity), NaN (not a number), or any other suitable reserved values.

In some embodiments, the floating-point data can include a sign component. For example, the sign component can define whether the number represented by the floating-point data is positive or negative. For example, the sign component can include a bit capable of having one of two values. A first of the two values can indicate that the number is positive, and the second of the two values can indicate that the number is negative. For example, a logical low (e.g., zero) can indicate that the number is positive, and a logical high (e.g., one) can indicate that the number is negative. For example, the sign component can define the sign of a number according to $(-1)^s$, where s is the sign component.

In some embodiments, the floating-point data can include an exponent component. The exponent component can represent a power that a base is raised to. For instance, the exponent component can define an order of magnitude of the represented number. As an example, the exponent component can define the order of magnitude as $b^{(e-o)}$, where b is a base value, e is the value of an exponent component, and o is an offset value. For example, the offset value can be selected such that the smallest possible exponent representable by a standard is a minimum value (e.g., zero or one).

In some embodiments, the floating-point data can include a mantissa component (or a significand component). The mantissa component can define the significant numerals of the floating-point number. The value of the mantissa component, when multiplied by the value of the sign component and/or the base value raised to the value of the exponent component, gives the value of the floating-point number. In some embodiments, the mantissa component can be stored such that the first numeral of the floating-point number has a known value. For example, in binary representation, the mantissa component can be defined as the values trailing a radix point. In some cases, the value of a numeral immediately leading the radix point is defined by the standard. For example, in binary representation, the value of the numeral immediately leading the radix point can always be zero or always be one.

According to example aspects of the present disclosure, one or more computing devices can obtain a first portion and/or a second portion of the subject data. For instance, the first portion and/or the second portion can be a subset of the data. For example, the first portion and/or the second portion can include one or more numerals. In some embodiments, the first portion and/or the second portion are defined for each data item in a plurality of data items in the subject data. For instance, each data item in the plurality of data items can be split into a first portion and/or a second portion. In some embodiments, each data item in the plurality of data items can be split at the same point. For instance, in one example embodiment, the first portion is a compressible portion and the second portion is an uncompressible portion.

In some embodiments, the first portion can be a compressible portion of the subject data. The first (e.g., compressible) portion can be effectively compressed according to lossless compression techniques. For instance, the first (e.g., compressible) portion can be effectively compressed without information loss. For example, a size of the first (e.g., compressible) portion can be significantly reduced without information loss.

The first (e.g., compressible) portion can exhibit statistical redundancy such that at least a portion of compressible portion can be predicted or otherwise recreated based on the statistical redundancy. One example of statistical redundancy includes having consecutive recurring values of a portion of a data item (e.g., one or more numerals) across a plurality of data items in the subject data. For example, the portion of a plurality of data items can remain constant or otherwise change infrequently across the plurality of data items. The compressible portion can exhibit statistical redundancy allowing the compressible portion to be compressed by any suitable compression technique, such as, but not limited to, Lempel-Zip-Markov chain algorithm (LZMA), Burrows-Wheeler algorithm (e.g., bzip2), DEFLATE algorithm (e.g., gzip), machine-learning compression techniques, or any other suitable compression technique. For example, consecutive recurring values can be represented as a value and a number of consecutive recurrences of the value. This representation can require less memory to store and/or transmit than representing the value uniquely at each recurrence.

In some embodiments, the second portion can be an uncompressible portion of the data. That is, the second (e.g., uncompressible) portion can be a portion of the data that may not be effectively compressed according to lossless compression techniques. For instance, the second (e.g., uncompressible) portion can exhibit limited to no statistical redundancy such that a size of the second (e.g., uncompressible) portion may not be significantly reduced without information loss. For example, the second (e.g., uncompressible) portion can include portions of a plurality of data items such that the values of the portions exhibit little to no repetition, especially consecutive repetition, across the plurality of data items. For example, the second (e.g., uncompressible) portion can experience a decrease in size of less than about 10% when compressed according to conventional compression methods. However, even when the non-quantized values are hard to compress, the indices can be usually benefit from LZMA/bzip or similar compression method.

In some embodiments, the subject data can include a plurality of data blocks. The data blocks can be sequential. The data blocks can have a similar or identical format. In some embodiments in which the subject data includes a plurality of data blocks, each data block can be compressed as described herein. For example, the respective data included in each data block can include a first (e.g., compressible) portion and a second (e.g., uncompressible) portion. The first and second portions of each respective data block can be compressed using first and second techniques, as described herein.

In some embodiments, the first portion and/or the second portion can be portions of floating-point data. For instance, the first portion can be a compressible portion of floating-point data and the second portion can be an uncompressible portion of floating-point data. For example, the first portion can include a sign component and/or an exponent component and/or at least a portion of a mantissa component. For example, the at least a portion of the mantissa component can include about one to about three numerals of the mantissa component. In some embodiments, the about one to about three numerals can be about one to about three of the most significant numerals of the mantissa component. The second portion may include the mantissa component or the remainder of the mantissa component if a part of the mantissa component is present in the first portion. The first portion and/or the second portion can include a plurality of data items. In other implementations, other allocations (e.g., other than the example allocation described above) of the different components of the data or subcomponents thereof into two or more portions can be used.

As one example application, in some cases, floating-point data defining machine-learned model parameters can be stored as a tensor. That is, the subject data may be a tensor, such as a tensor storing machine-learned model parameters. Each component in the tensor can correspond to a floating-point number defining a unique machine-learned parameter. Each component in the tensor can thus have an associated sign component, exponent component, and/or mantissa component. In some cases, a portion of the tensor components can be compressible. For instance, a portion of the tensor components (e.g., the sign and exponent components) can exhibit statistical redundancy across some aspect of the tensor, such as across one or more dimensions of the tensor. In some cases, a portion of the tensor components can be uncompressible. For instance, a portion of the tensor components (e.g., the mantissa component or portions thereof) can be uniquely defined at each tensor component.

According to example aspects of the present disclosure, one or more computing devices can transform a portion of the subject data to obtain transformed data. For instance, the one or more computing devices can transform an uncompressible portion of the subject data. For example, the one or more computing devices can transform the portion of the subject data such that the norm of the portion of the subject data is minimized.

For instance, in some embodiments, transforming the portion of the subject data can include linearizing the subject data and/or linearizing the portion of the subject data. For instance, linearizing the subject data and/or the portion of the subject data can include representing the subject data and/or the portion of the subject data as a vector. For example, in some cases the subject data can be represented as a multi-dimensional matrix or tensor. In these cases, the subject data and/or the portion of the subject data (e.g., an uncompressible portion) can be linearized to a vector representation. Any suitable method of linearization can be employed in accordance with the present disclosure.

One example transformation according to example aspects of the present disclosure is a Kashin Decomposition. A Kashin Decomposition transforms a frame representation of a vector in a complex number frame having n dimensions into a frame expansion having N dimensions, N>n, with coefficients having the smallest possible dynamic range, referred to herein as a Kashin representation. For instance, the dynamic range of the coefficients can be on the order of $$o\left(\frac{1}{\sqrt{n}}\right).$$

Information contained in the vector can thus be spread about evenly and/or evenly among the coefficients. For instance, a Kashin Decomposition can transform a vector x and a frame $(u_i)_{i=1}^N$ into a frame representation with coefficients $a_i$ such that $x=\Sigma_{i=1}^N a_i u_i$. For instance, the coefficients can be defined as $a_i=\langle x, u_i\rangle$. In particular, the coefficients can be bounded by a level K. For instance, the coefficients can be bounded by $$\max_i |a_i| \le \frac{K}{\sqrt{N}} \|x\|_2,$$

where $\|x\|_2$ is the L2 norm of x. An example method of transforming a vector x according to a Kashin Decomposition is discussed with reference to FIG. 4.

Transforming a portion of the subject data according to a Kashin Decomposition can provide for several advantages. For instance, transforming the subject data according to a Kashin Decomposition can spread information contained in the portion of the subject data about evenly and/or evenly across a plurality of coefficients. For instance, each iterative step of truncating a frame representation and determining a frame representation of the residual can conceptually "shave" information in x at the larger coefficients and "redistribute" this information at the smaller coefficients. This can be repeated until the error is desirably evenly spread. Thus, if an error is introduced into the plurality of coefficients (e.g., error from quantizing the plurality of coefficients), the error is associated with the plurality of coefficients instead of the portion of the subject data. Thus, if the portion of subject data is recreated from transformed data having an error, the error is spread about evenly and/or evenly among the recreated data, which can better preserve the portion of subject data in the recreated data.

According to example aspects of the present disclosure, one or more computing devices can quantize the transformed data to obtain quantized data. The transformed data can be quantized to reduce a precision associated with the transformed data. For example, the quantized data can have a lower number of numerals than the transformed data. By reducing the number of numerals, the quantized data can have a smaller size in memory than the transformed data. Any suitable quantization methods can be employed in accordance with example aspects of the present disclosure. The quantization methods may comprise compression techniques and/or the quantized data may be further compressed after quantization.

In some embodiments, the transformed data can be quantized by uniform quantization. For instance, the transformed data can be rounded to a nearest value having a lower precision (e.g., a lower number of numerals) than the transformed data to obtain the quantized data. For example, the quantized data can define a plurality of quantization levels, with the transformed data having values generally between two quantization levels. In one embodiment, for example, if an item of transformed data has a value between two quantization levels and less than a midpoint defined between the two quantization levels, the value of the corresponding quantized data item is selected as the lower of the two quantization levels. Otherwise, the value of the corresponding quantized data item is selected as the higher of the two quantization levels.

In some embodiments, the transformed data can be quantized by truncating at least a portion of the transformed data. For example, less significant bits (e.g., bits having a relatively lower associated magnitude) can be truncated from the transformed data. In other words, the value of the transformed data can be floored to the nearest of a plurality of quantization levels, resulting in the floored data having one or more trailing zeroes. The one or more trailing zeroes can be omitted from storage and/or restored at a later point in computation to reduce a memory requirement to store the quantized data compared to the transformed data.

In some embodiments, the transformed data can be quantized by mapping the transformed data to one of a plurality of index values. For instance, in one example embodiment, the transformed data is rounded, floored, etc., to a nearest value associated with one of the plurality of index values and the index value associated with the nearest value is stored, for example, as an alternative to storing the transformed data.

Quantizing the transformed data to obtain quantized data can introduce a quantization error into the quantized data. However, transforming the original data (e.g., by Kashin Decomposition) prior to quantizing the data can allow for the quantization error to be spread or "smeared" across the original data. In other words, the quantization error is not concentrated at particular items in the original data but is instead spread among the items. Thus, while an error is still introduced in the quantized data, the error can be better handled in an application of the data. For example, machine-learned models having parameters defined by the data can be less affected by the error in the data compared to conventional compression.

According to example aspects of the present disclosure, one or more computing devices can store the quantized data. For example, the one or more computing devices can store the quantized data in one or more memory devices. Example memory devices include, but are not limited to, non-transitory computer-readable storage mediums, such as RAM, ROM, EEPROM, EPROM, flash memory devices, magnetic disks, etc., and combinations thereof.

Additionally and/or alternatively, the one or more computing devices can store a compressed portion of the subject data. For example, the compressed portion can be a compressible portion of the subject data that is compressed according to any suitable compression technique, especially lossless compression techniques. For example, the compressed portion can be compressed by any suitable compression technique, such as, but not limited to, Lempel-Zip-Markov chain algorithm (LZMA), Burrows-Wheeler algorithm (e.g., bzip2), DEFLATE algorithm (e.g., gzip), machine-learning compression techniques, or any other suitable compression technique.

Additionally and/or alternatively, the one or more computing devices can transmit the quantized data. For example, the quantized data can be transmitted from a first computing device to a second computing device. As another example, the quantized data can be transmitted from a first location (e.g., a first memory address) to a second location (e.g., a second memory address). The quantized data can be transmitted by any suitable method of transmission. For example, the quantized data can be transmitted by wired transmission (e.g., ethernet) and/or by wireless transmission (e.g., Bluetooth, ZigBee, WLAN, IEEE 802.11), or by any other suitable transmission methods or technologies.

Additionally and/or alternatively, the one or more computing devices can transmit a compressed portion of the subject data. For example, the compressed portion can be a compressible portion of the subject data that is compressed according to any suitable compression technique, especially lossless compression techniques. For example, the compressed portion can be compressed by any suitable compression technique, such as, but not limited to, Lempel-Zip-Markov chain algorithm (LZMA), Burrows-Wheeler algorithm (e.g., bzip2), DEFLATE algorithm (e.g., gzip), machine-learning compression techniques, or any other suitable compression technique.

In some embodiments, after storing and/or transmitting the quantized data, the one or more computing devices can reconstruct the subject data from the compressed data and/or the quantized data. For example, the one or more computing devices can decompress the compressed data to obtain the compressible portion from the compressed data. For instance, the compressible portion can be obtained from the compressed data with no loss of information.

Additionally and/or alternatively, the one or more computing devices can reconstruct the uncompressible portion from the quantized data. For instance, the one or more computing devices can reconstruct the transformed data from the quantized data. In some embodiments, the transformed data cannot be exactly reconstructed from the quantized data because of the quantization error introduced during quantization. In these cases, reconstructing the transformed data can include approximating the transformed data based on the quantized data. As another example, the quantized data can include indices mapped to corresponding values of the transformed data.

For example, the quantized data can be mapped to a corresponding value of the transformed data with less precision than the corresponding value. Reconstructing the transformed data can thus require increasing a precision of the quantized data. For instance, precision can be increased by appending numerals to the quantized data. As one example, if the transformed data is a 32-bit number and the quantized data is a 24-bit number, the quantized data has 8 fewer bits of precision than the transformed data. In some embodiments, the most significant 24 bits of the transformed data are identical to the 24 bits of the quantized data. Thus, to approximate the transformed data from the quantized data, 8 trailing (i.e., least significant) bits can be appended to the 24 bits of the quantized data. In some embodiments, the trailing bits can be zeroes. In some embodiments, the quantized data can be dithered, such that the trailing bits can have a random value. Dithering can allow for the reconstructed transformed data to be offset from the quantized values by introducing controlled noise into the reconstructed data.

Additionally and/or alternatively, the uncompressible portion can be reconstructed from the transformed data, such as the reconstructed transformed data. For instance, an inverse transform can be applied to the transformed data to undo the transform and restore the original data. For example, in cases where the uncompressible portion is transformed by Kashin Decomposition, the uncompressible portion can be reconstructed from the frame expansion of the uncompressible portion. For example, if the uncompressible portion is represented as a frame representation of a vector x having a frame $(u_i)_{i=1}^N$ and coefficients $a_i$, the original data can be computed as $x=\Sigma_{i=1}^N a_i u_i$. Additionally and/or alternatively, if the uncompressible portion is transformed by linearization, the uncompressible portion can be reconstructed by restoring dimensions to the transformed data.

By storing and/or transmitting subject data as a compressed data portion and a transformed and quantized data portion, various advantages can be achieved. For instance, the compressed data portion can be transmitted with no loss of information. Additionally, the compressed data can be transmitted efficiently, as a high level of compression can be achieved. Additionally, although an error is introduced in the transformed and quantized data, the error can have a lessened effect on an application of the transformed and quantized data compared to data that is only quantized.

For instance, one technical effect according to example aspects of the present disclosure is to provide systems and methods for lossy data compression of low compressibility data such that a compression error necessarily resulting from compression of low compressibility data is spread across the low compressibility data. For example, the compression error can be spread across a plurality of data items in the low compressibility data. By spreading the compression error, certain characteristics of the data set can be better preserved after compression and decompression compared to conventional methods. For example, if the low compressibility data defines parameters of a machine-learned model, the tuning characteristics of the parameters can be better preserved. As another example, if the low compressibility data defines measurements, the measurements and/or relationships between values of the measurements can be better preserved. As another example, the error can be more easily compensated for by having a more uniform effect across the low compressibility data.

Another technical effect according to aspects of the present disclosure is to provide for techniques allowing a greater level of data compression compared to conventional methods without adversely affecting systems that use the data. For example, in cases where subject data defines parameters of a machine-learned model, the parameters can be compressed to a higher level of compression without adversely affecting the tuning of the machine-learned model. For instance, systems and methods according to example aspects of the present disclosure can be particularly beneficial in implementations that are sensitive to error and/or value compression level over speed of compression and/or decompression. Furthermore, some amount of lossy compression can even increase the robustness of the model.

For example, systems and methods according to the present disclosure can be applied to a federated learning technique for a machine-learned model to reduce an amount of data transmitted and/or improve accuracy of the machine-learned model. In federated learning techniques, a machine-learned model can be trained at one or more computing devices using data found at the one or more computing devices. The machine-learned model can then be transmitted to a second computing device (e.g., a device that seeks to utilize the machine-learned model). Benefits of federated learning include, for example, the ability to train a model with training data and use the model elsewhere without necessarily requiring transmission of the training data. This can be especially useful in cases where the training data is private or otherwise undesirable to transmit.

More particularly, in some example applications, a server can send a (e.g., partially trained, potentially "blank") machine learning model to a number of devices. The model can be compressed as described herein. This version of the model can be referred to as $model_{t_j}$. Each device can decompress the $model_{t_j}$ as described herein. Each device can then refines a copy of the model by training $model_{t_j}$ on local (e.g., private) data. Say the result is $model_{k(t_j)}$ for the kth device. A local update for the refined models can be sent back to the server either as $model_{k(t_i)}$, compressed as described herein or as an update difference $model_{k(t_i)}-model_{t_i}$, again compressed as described herein. The server can then decompresses each local update (e.g., $model_{k(t_i)}$ or $model_{k(t_i)}-model_{t_i}$ from each device k and can aggregate the refined models into $model_{t_{i+1}}$. This process can continue iteratively. For example, (e.g., once compressed) $model_{t_{i+1}}$ can be sent again to the population of devices for use and/or further training. In some implementations, the population of devices at t+1 can be different than the one at the previous step t and/or the local data that is used to perform the update can be different. Thus, training can keep continuing with the steps above, while devices can use the model (e.g., assuming that the quality is sufficient) for local inference. It is also possible that the updated aggregate model is used on the server side. In some implementations, for privacy benefits, the server never materializes (e.g., stores on disk or other support) the model updates received from the devices, but instead keeps all of the model updates in volatile memory until aggregation.

As another example application with technical benefits, the compression/decompression schemes described herein can be used in a model sharing framework in which a compressed model is sent from a first device (e.g., a server) to a second device (e.g., a client such as a user's device). As another example, the first and second devices can be peer devices rather than server/client. The first device can also provide to the second device a codec (also known as compressor/decompressor) that the second device can use to decompress and/or re-compress the model or updates to the model. The first device can provide the second device with a new or updated codec over time.

As another example technical effect and benefit, transmission bandwidth can be reduced. In particular, transmitting a machine-learned model can require significant network bandwidth, however, as the machine-learned model can include a large amount of data. Furthermore, lossless compression techniques can have limited effectiveness due to the uniqueness of model parameters. Additionally, conventional lossy compression techniques can introduce error into the model parameters, especially unevenly into the model parameters, which can affect the tuning of the machine-learned model. By employing systems and methods according to the present disclosure, however, the model can be transmitted using less data than lossless compression while simultaneously having less of a negative effect on the tuning of the machine-learned model.

Example Devices and Systems

FIG. 1A depicts a block diagram of an example computing system 100 according to example embodiments of the present disclosure. The system 100 includes a user computing device 102, a server computing system 130, and a training computing system 150 that are communicatively coupled over a network 180.

The user computing device 102 can be any type of computing device, such as, for example, a personal computing device (e.g., laptop or desktop), a mobile computing device (e.g., smartphone or tablet), a gaming console or controller, a wearable computing device, an embedded computing device, or any other type of computing device.

The user computing device 102 includes one or more processors 112 and a memory 114. The one or more processors 112 can be any suitable processing device (e.g., a processor core, a microprocessor, an ASIC, a FPGA, a controller, a microcontroller, etc.) and can be one processor or a plurality of processors that are operatively connected. The memory 114 can include one or more non-transitory computer-readable storage mediums, such as RAM, ROM, EEPROM, EPROM, flash memory devices, magnetic disks, etc., and combinations thereof. The memory 114 can store data 116 and instructions 118 which are executed by the processor 112 to cause the user computing device 102 to perform operations.

In some implementations, the user computing device 102 can store or include one or more machine-learned models 120. For example, the machine-learned models 120 can be or can otherwise include various machine-learned models such as neural networks (e.g., deep neural networks) or other types of machine-learned models, including non-linear models and/or linear models. Neural networks can include feed-forward neural networks, recurrent neural networks (e.g., long short-term memory recurrent neural networks), convolutional neural networks or other forms of neural networks. Example machine-learned models 120 are discussed with reference to FIG. 2.

In some implementations, the one or more machine-learned models 120 can be received from the server computing system 130 over network 180, stored in the user computing device memory 114, and then used or otherwise implemented by the one or more processors 112. For example, the models 120 can be stored in the user computing device memory 114 according to the method for storing compressed data illustrated in FIG. 4. As another example, the models 120 can be transmitted between the user computing device 102 and/or the server computing system 130 according to the method for transmitting compressed data illustrated in FIG. 5. In some implementations, the user computing device 102 can implement multiple parallel instances of a single machine-learned model 120 (e.g., to perform parallel prediction tasks across multiple instances of related and/or unrelated input features).

Additionally or alternatively, one or more machine-learned models 140 can be included in or otherwise stored and implemented by the server computing system 130 that communicates with the user computing device 102 according to a client-server relationship. For example, the machine-learned models 140 can be implemented by the server computing system 140 as a portion of a web service (e.g., a machine-learning service). Thus, one or more models 120 can be stored and implemented at the user computing device 102 and/or one or more models 140 can be stored and implemented at the server computing system 130.

The user computing device 102 can also include one or more user input component 122 that receives user input. For example, the user input component 122 can be a touch-sensitive component (e.g., a touch-sensitive display screen or a touch pad) that is sensitive to the touch of a user input object (e.g., a finger or a stylus). The touch-sensitive component can serve to implement a virtual keyboard. Other example user input components include a microphone, a traditional keyboard, or other means by which a user can provide user input.

The user computing device 102 can include one or more compressor/decompressors 124. The compressor/decompressor 124 can compress and/or decompress data according to any of the compression techniques described herein. The compressor/decompressor 124 can be included in a particular application or can be implemented by an operating system of the user computing device 102. The compressor/decompressor 124 includes computer logic utilized to provide desired functionality. The compressor/decompressor 124 can be implemented in hardware, firmware, and/or software controlling a general purpose processor.

The server computing system 130 includes one or more processors 132 and a memory 134. The one or more processors 132 can be any suitable processing device (e.g., a processor core, a microprocessor, an ASIC, a FPGA, a controller, a microcontroller, etc.) and can be one processor or a plurality of processors that are operatively connected. The memory 134 can include one or more non-transitory computer-readable storage mediums, such as RAM, ROM, EEPROM, EPROM, flash memory devices, magnetic disks, etc., and combinations thereof. The memory 134 can store data 136 and instructions 138 which are executed by the processor 132 to cause the server computing system 130 to perform operations.

In some implementations, the server computing system 130 includes or is otherwise implemented by one or more server computing devices. In instances in which the server computing system 130 includes plural server computing devices, such server computing devices can operate according to sequential computing architectures, parallel computing architectures, or some combination thereof.

As described above, the server computing system 130 can store or otherwise include one or more machine-learned models 140. For example, the models 140 can be or can otherwise include various machine-learned models. Example machine-learned models include neural networks or other multi-layer non-linear models. Example neural networks include feed forward neural networks, deep neural networks, recurrent neural networks, and convolutional neural networks. Example models 140 are discussed with reference to FIG. 2.

The server computing system 130 can include one or more compressor/decompressors 142. The compressor/decompressor 142 can compress and/or decompress data according to any of the compression techniques described herein. The compressor/decompressor 142 can be included in a particular application or can be implemented by an operating system of the server computing system 130. The compressor/decompressor 142 includes computer logic utilized to provide desired functionality. The compressor/decompressor 142 can be implemented in hardware, firmware, and/or software controlling a general purpose processor.

The user computing device 102 and/or the server computing system 130 can train the models 120 and/or 140 via interaction with the training computing system 150 that is communicatively coupled over the network 180. The training computing system 150 can be separate from the server computing system 130 or can be a portion of the server computing system 130. For instance, the models 120 and/or 140 can be trained at the training computing system 150 and transmitted to the user computing device 102 and/or the server computing system 130. For example, the models 120 and/or 140 can be transmitted according to the method for transmitting compressed data illustrated in FIG. 5.

The training computing system 150 includes one or more processors 152 and a memory 154. The one or more processors 152 can be any suitable processing device (e.g., a processor core, a microprocessor, an ASIC, a FPGA, a controller, a microcontroller, etc.) and can be one processor or a plurality of processors that are operatively connected. The memory 154 can include one or more non-transitory computer-readable storage mediums, such as RAM, ROM, EEPROM, EPROM, flash memory devices, magnetic disks, etc., and combinations thereof. The memory 154 can store data 156 and instructions 158 which are executed by the processor 152 to cause the training computing system 150 to perform operations. In some implementations, the training computing system 150 includes or is otherwise implemented by one or more server computing devices.

The training computing system 150 can include a model trainer 160 that trains the machine-learned models 120 and/or 140 stored at the user computing device 102 and/or the server computing system 130 using various training or learning techniques, such as, for example, backwards propagation of errors. For example, a loss function can be back-propagated through the model(s) to update one or more parameters of the model(s) (e.g., based on a gradient of the loss function). Various loss functions can be used such as mean squared error, likelihood loss, cross entropy loss, hinge loss, and/or various other loss functions. Gradient descent techniques can be used to iteratively update the parameters over a number of training iterations.

In some implementations, performing backwards propagation of errors can include performing truncated back-propagation through time. The model trainer 160 can perform a number of generalization techniques (e.g., weight decays, dropouts, etc.) to improve the generalization capability of the models being trained.

In particular, the model trainer 160 can train the machine-learned models 120 and/or 140 based on a set of training data 162. The training data 162 can include, for example, pairs of input features and associated class labels. For example, the input features may include features used for natural language processing, such as raw or processed linguistic information. As another example, the input features may include image features, such as raw or processed images. As another example, the input features may include features used for content recommendation services, such as web usage or other suitable information. The input features can have associated labels. For example, the labels may be indicative of a desired aspect of training, such as a true class associated with some or all of the input features.

In some implementations, if the user has provided consent, the training examples can be provided by the user computing device 102. Thus, in such implementations, the model 120 provided to the user computing device 102 can be trained by the training computing system 150 on user-specific data received from the user computing device 102. In some instances, this process can be referred to as personalizing the model.

The model trainer 160 includes computer logic utilized to provide desired functionality. The model trainer 160 can be implemented in hardware, firmware, and/or software controlling a general purpose processor. For example, in some implementations, the model trainer 160 includes program files stored on a storage device, loaded into a memory and executed by one or more processors. In other implementations, the model trainer 160 includes one or more sets of computer-executable instructions that are stored in a tangible computer-readable storage medium such as RAM hard disk or optical or magnetic media. In some implementations, the model trainer 160 can perform any of the compression/decompression techniques described herein.

The network 180 can be any type of communications network, such as a local area network (e.g., intranet), wide area network (e.g., Internet), or some combination thereof and can include any number of wired or wireless links. In general, communication over the network 180 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

FIG. 1A illustrates one example computing system that can be used to implement the present disclosure. Other computing systems can be used as well. For example, in some implementations, the user computing device 102 can include the model trainer 160 and the training dataset 162. In such implementations, the models 120 can be both trained and used locally at the user computing device 102. In some of such implementations, the user computing device 102 can implement the model trainer 160 to personalize the models 120 based on user-specific data. As another example, in some implementations, the training computing system 150 can include a compressor and/or decompressor (e.g., as described at 124 and 142). By having a compressor/decompressor at the training computing system 150, the training computing system 150 can participate in the example federated learning application described above. For example, all communication across network 180 can occur in compressed form.

Figure 1B:
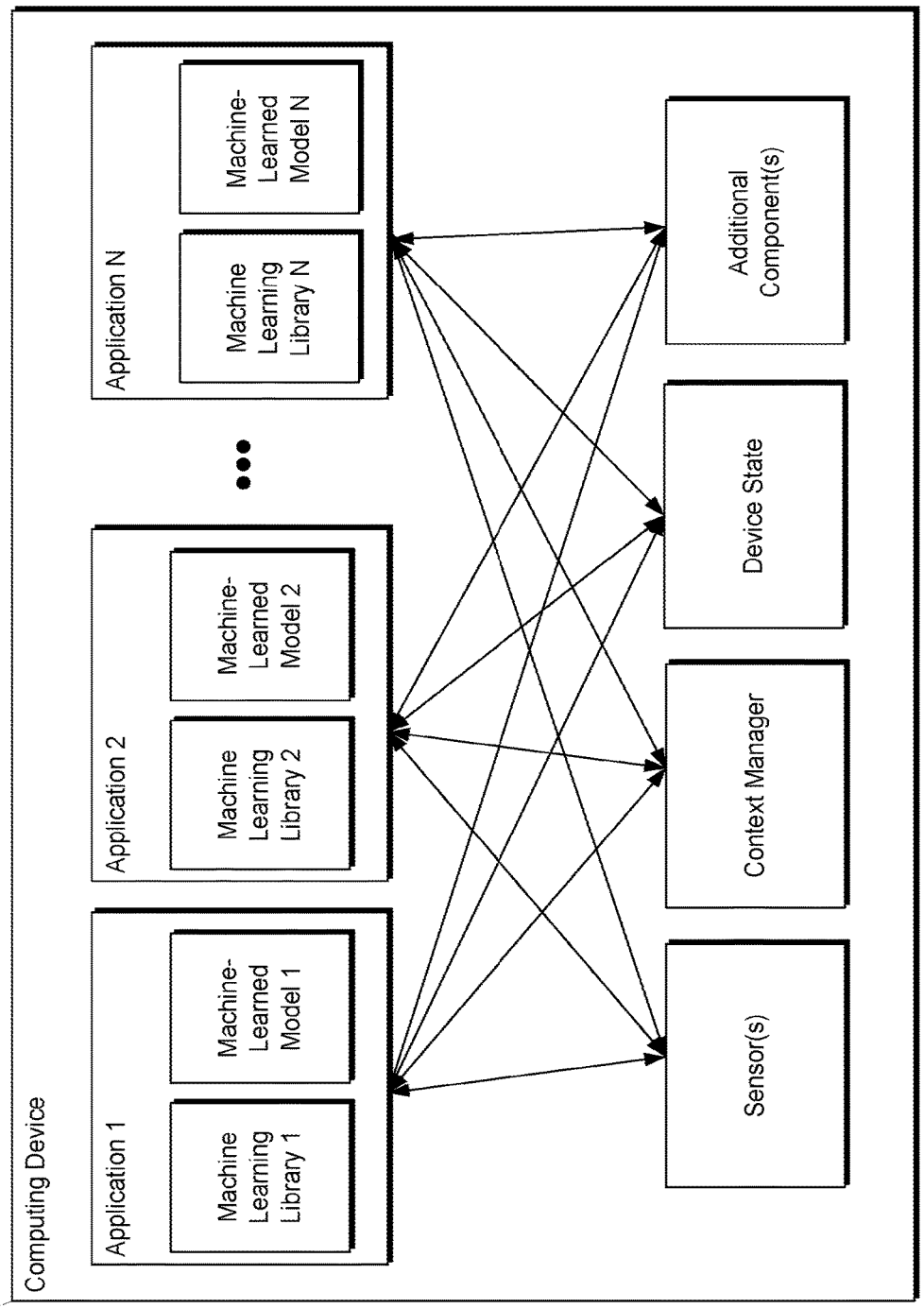
FIG. 1B depicts a block diagram of an example computing device according to example embodiments of the present disclosure.

FIG. 1B depicts a block diagram of an example computing device 10 that performs according to example embodiments of the present disclosure. The computing device 10 can be a user computing device or a server computing device.

The computing device 10 includes a number of applications (e.g., applications 1 through N). Each application contains its own machine learning library and machine-learned model(s). For example, each application can include a machine-learned model. Example applications include a text messaging application, an email application, a dictation application, a virtual keyboard application, a browser application, etc.

As illustrated in FIG. 1B, each application can communicate with a number of other components of the computing device, such as, for example, one or more sensors, a context manager, a device state component, and/or additional components. In some implementations, each application can communicate with each device component using an API (e.g., a public API). In some implementations, the API used by each application is specific to that application.

Figure 1C:
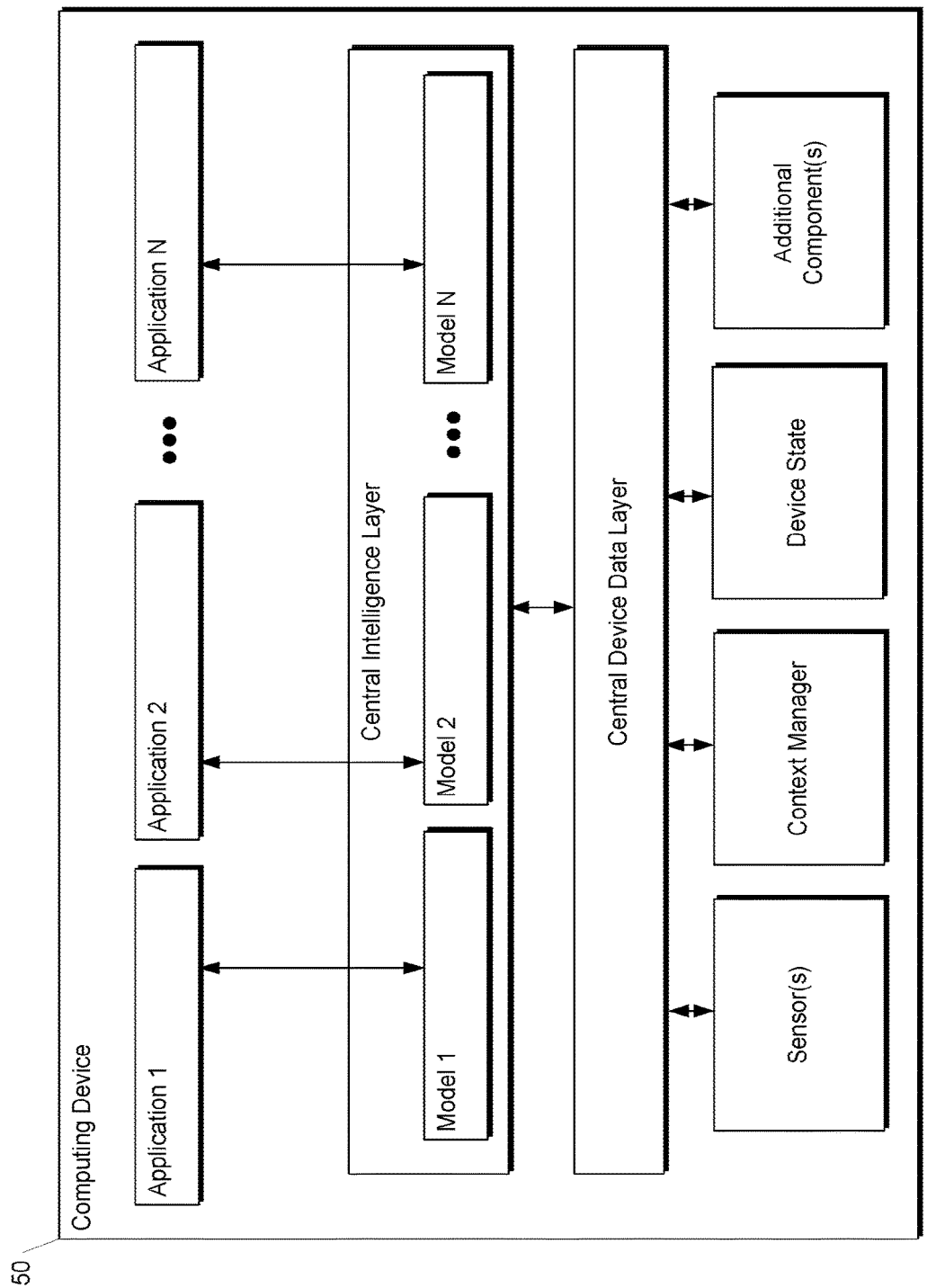
FIG. 1C depicts a block diagram of an example computing device according to example embodiments of the present disclosure.

FIG. 1C depicts a block diagram of an example computing device 50 that performs according to example embodiments of the present disclosure. The computing device 50 can be a user computing device or a server computing device.

The computing device 50 includes a number of applications (e.g., applications 1 through N). Each application is in communication with a central intelligence layer. Example applications include a text messaging application, an email application, a dictation application, a virtual keyboard application, a browser application, etc. In some implementations, each application can communicate with the central intelligence layer (and model(s) stored therein) using an API (e.g., a common API across all applications).

The central intelligence layer includes a number of machine-learned models. For example, as illustrated in FIG. 1C, a respective machine-learned model (e.g., a model) can be provided for each application and managed by the central intelligence layer. In other implementations, two or more applications can share a single machine-learned model. For example, in some implementations, the central intelligence layer can provide a single model (e.g., a single model) for all of the applications. In some implementations, the central intelligence layer is included within or otherwise implemented by an operating system of the computing device 50.

The central intelligence layer can communicate with a central device data layer. The central device data layer can be a centralized repository of data for the computing device 50. As illustrated in FIG. 1C, the central device data layer can communicate with a number of other components of the computing device, such as, for example, one or more sensors, a context manager, a device state component, and/or additional components. In some implementations, the central device data layer can communicate with each device component using an API (e.g., a private API).

FIG. 2 depicts a block diagram of an example machine-learned model 200 according to example embodiments of the present disclosure. In some implementations, the machine-learned model 200 is trained to receive a set of input data 204 descriptive of input features and, as a result of receipt of the input data 204, provide output data 206 that is indicative of one or more outputs (e.g., a prediction). One of ordinary skill in the art will recognize that the systems and methods according to example aspects of the present disclosure can be extended to any suitable machine-learning task.

FIG. 3 depicts a block diagram of example data 300 according to example embodiments of the present disclosure. The data 300 can be floating-point data. For example, the data 300 includes a sign component 302, exponent component 304, and mantissa component 306. The data 300 is a 16-bit floating point number having one numeral in the sign component 302, six numerals in the exponent component 304, and nine numerals in the mantissa component 306 for the purposes of illustration. One of ordinary skill in the art will understand that data having any suitable number of numerals in each of the sign component 302, exponent component 304, and mantissa component 306 can be used in accordance with the present disclosure. For example, 32-bit floating-point numbers having one, eight, and twenty-three numerals in the sign, exponent, and mantissa component, respectively, can be used in accordance with the present disclosure. As another example, 64-bit "double precision" floating-point numbers having one, eleven, and fifty-two numerals in the sign, exponent, and mantissa component, respectively, can be used in accordance with the present disclosure.

The data 300 can include a first portion 310 and a second portion 312. As illustrated in FIG. 3, the portions 310, 312 are divided as being on the left or right of line 311. However, one of ordinary skill in the art will understand that any suitable numerals of any of the sign component 302, exponent component 304, and/or mantissa component 306 can be included in either the first portion 310 and/or the second portion 312. For example, the line 311 can be located between any two numerals in the data 300. As another example, the numerals in the data 300 can be partitioned individually, such as without regard to position within the data 300.

In some embodiments, the first portion 310 can include numerals that are compressible across a collection of data (e.g., a data set including data 300). For instance, as illustrated in FIG. 3, the entire sign component 302 and exponent component 304 are included in the first portion 310 along with two numerals of the mantissa component 306. These numerals can, in some cases, exhibit statistical redundancy across a plurality of data (e.g., a data set including data 300), allowing them to be effectively compressed according to conventional compression techniques.

In some embodiments, the second portion 312 can include numerals that are not compressible across a collection of data (e.g., a data set including data 300). For instance, as illustrated in FIG. 3, a portion of the numerals of the mantissa component 306 are included in the second portion 312. These numerals can, in some cases, exhibit limited to no statistical redundancy across a plurality of data (e.g., a data set including data 300), preventing them from being effectively compressed according to conventional compression techniques.

Example Methods

Figure 4:
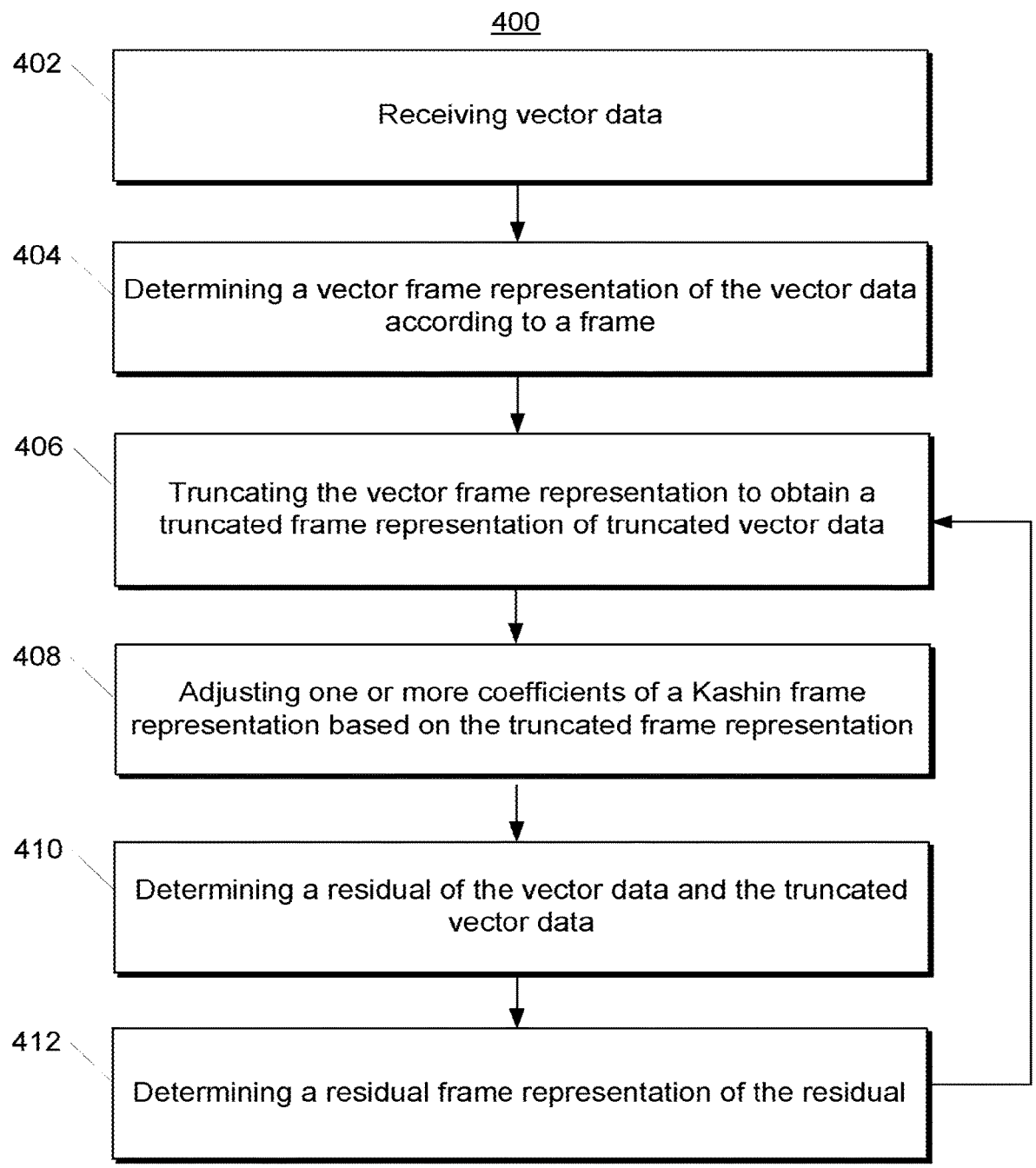
FIG. 4 depicts a flow chart diagram of an example method of transforming data according to example embodiments of the present disclosure.

FIG. 4 depicts a flow chart diagram of an example method for transforming data according to example embodiments of the present disclosure. Although FIG. 4 depicts steps performed in a particular order for purposes of illustration and discussion, the methods of the present disclosure are not limited to the particularly illustrated order or arrangement. The various steps of the method 400 can be omitted, rearranged, combined, and/or adapted in various ways without deviating from the scope of the present disclosure.

At 402, a computing system can receive vector data. For instance, the vector data can include data representative of a vector. As another example, the vector data can be represented in a vector format. For example, in some embodiments, the vector data can represent a linearized multi-dimensional matrix, the linearized matrix having a single dimension. For example, the vector data can be a vector x having n dimensions.

In some embodiments, an initial Kashin frame representation and/or initial truncation level can be initialized. For example, the initial Kashin frame representation can be initialized as one or more coefficients $a_i$, where $i=1, \ldots, N$. In some embodiments, each of the coefficients can be initialized at zero. As another example, the initial truncation level can be initialized as $$M = \frac{\|x\|_2}{\sqrt{\delta N}}.$$

At 404, the computing system can determine a vector frame representation of the vector data. For example, the vector x can be transformed into a frame representation in a frame $(u_i)_{i=1}^N$ having N dimensions, N>n. The frame representation can include one or more coefficients, such as N coefficients. For instance, the frame representation can include coefficients $b_i$ such that $x=\Sigma_{i=1}^N b_i u_i$. For instance, the coefficients can be defined as $b_i = \langle x, u_i \rangle$. In some embodiments, the frame can satisfy an uncertainty principle. For example, the uncertainty principle can be satisfied if $\|\Sigma_{i \in \Omega} b_i u_i\| \leq \eta (\Sigma_{i \in \Omega} |b_i|^2)^{1/2}$, where $\Omega$ is every subset of $\{1, 2, \ldots, N\}$, $|\Omega| \leq \delta N$.

At 406, the computing system can truncate the vector frame representation to obtain a truncated frame representation. For example, the vector frame representation can be truncated at level at a level $$M = \eta^j \frac{\|x\|_2}{\sqrt{\delta N}},$$

where j represents an iterative number (e.g., $j=0, \ldots, r$). For example, truncating the frame representation can include truncating one or more coefficients $b_i$ of the vector frame representation to obtain one or more truncated coefficients $b_i'$. For instance, the truncated frame representation can be a Kashin representation of vector x' with level $$K = \frac{1}{\sqrt{\delta}}.$$

At 408, the computing system can adjust one or more coefficients of a Kashin frame representation based on the truncated frame representation. For example, in some embodiments, the one or more truncated coefficients can be added to the Kashin frame coefficients. In some embodiments, the one or more truncated coefficients can be scaled by a factor (e.g., by $\sqrt{N}$) and added to the Kashin frame coeffecients. Additionally and/or alternatively, the truncation level can be adjusted. For example, the truncation level can be increased by a factor of $\eta$.

At 410, the computing system can determine a residual. For instance, the residual can be the difference between the vectors represented by the frame representation before and after truncation (e.g., x−x').

At 412, the computing system can determine a residual frame representation of the residual. For example, the frame representation of the residual can be computed according to the frame $(u_i)_{i=1}^N$ that satisfies the uncertainty principle.

The steps 406-412 can be repeated iteratively. For instance, the steps 406-412 can be repeated iteratively where the residual frame representation is truncated instead of the vector frame representation from the second iteration onward, until the coefficients of the Kashin frame representation satisfy $$\max_i |a_i| \leq \frac{K}{\sqrt{N}} \|x\|_2.$$

For instance, in some implementations, the result of the last iteration is a Kashin frame representation which satisfies $$\max_i |a_i| \leq \frac{K}{\sqrt{N}} \|x\|_2.$$

In some implementations, the residual frame representation is not truncated prior to the Kashin frame representation being adjusted. This allows for an exact Kashin frame representation to be achieved.

Figure 5:
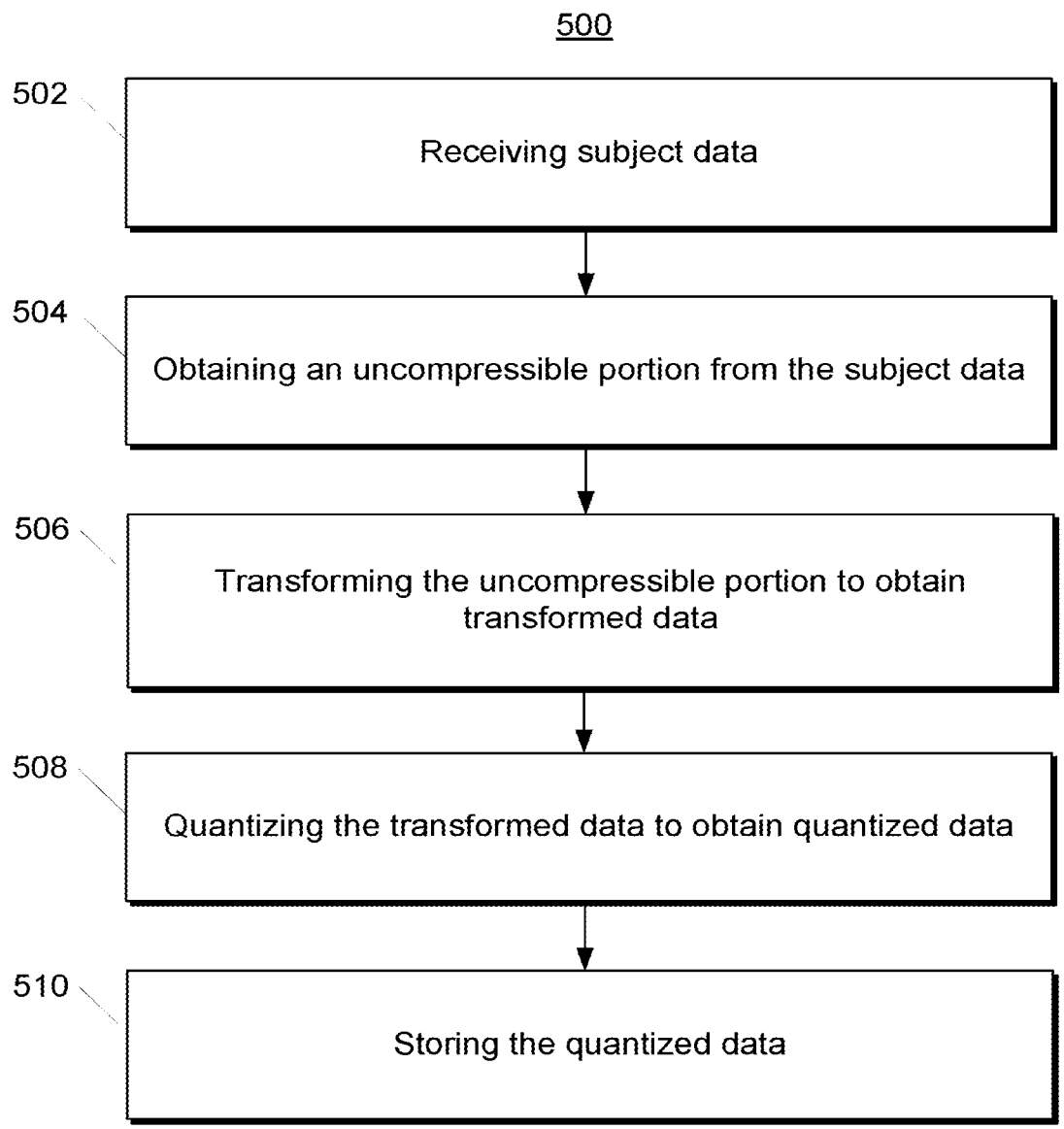
FIG. 5 depicts a flow chart diagram of an example method of storing compressed data according to example embodiments of the present disclosure.

FIG. 5 depicts a flow chart diagram of an example method for storing compressed data according to example embodiments of the present disclosure. Although FIG. 5 depicts steps performed in a particular order for purposes of illustration and discussion, the methods of the present disclosure are not limited to the particularly illustrated order or arrangement. The various steps of the method 500 can be omitted, rearranged, combined, and/or adapted in various ways without deviating from the scope of the present disclosure.

At 502, a computing system can receive subject data. For instance, the subject data can include a data set. The subject data and/or the data set can include a plurality of data items. For instance, each of the data items can define a value, such as a lexical and/or numerical value. The subject data can be stored according to any suitable format. For example, in some embodiments, the subject data can be floating-point data. In some embodiments, the floating-point data can include a sign component, an exponent component, and/or a mantissa component.

At 504, the computing system can obtain an uncompressible portion from the subject data. For instance, the uncompressible portion can be a portion of the subject data that may not be effectively compressed according to lossless compression techniques. For instance, the uncompressible portion can exhibit limited to no statistical redundancy such that a size of the uncompressible portion may not be significantly reduced without information loss. For example, the uncompressible portion can include portions of a plurality of data items such that the values of the portions exhibit little to no repetition, especially consecutive repetition, across the plurality of data items.

At 506, the computing system can transform the uncompressible portion to obtain transformed data. For example, the computing system can transform the uncompressible portion such that the norm of the uncompressible portion is minimized. For example, the computing system can transform the uncompressible portion according to a Kashin Decomposition.

At 508, the computing system can quantize the transformed data to obtain quantized data. For instance, the transformed data can be quantized to reduce a precision associated with the transformed data. For example, the quantized data can have a lower number of numerals than the transformed data. Any suitable quantization methods can be employed to quantize the transformed data. For example, the transformed data can be quantized by uniform quantization. As another example, the transformed data can be quantized by truncating at least a portion of the transformed data. For instance, less significant bits can be truncated from the transformed data. As another example, the transformed data can be quantized by mapping the transformed data to one of a plurality of index values.

At 510, the computing system can store the quantized data. For example, the one or more computing devices can store the quantized data in one or more memory devices. Example memory devices include, but are not limited to, non-transitory computer-readable storage mediums, such as RAM, ROM, EEPROM, EPROM, flash memory devices, magnetic disks, etc., and combinations thereof.

Additionally and/or alternatively, the one or more computing devices can store a compressed portion of the subject data. For example, the compressed portion can be a compressible portion of the subject data that is compressed according to any suitable compression technique, especially lossless compression techniques. For instance, the compressible portion of the compressed data can be a separate portion of the compressed data from the uncompressible portion. For example, the compressible portion can be the data in the compressible portion that is not in the uncompressible portion. The compressed portion can be compressed by any suitable compression technique, such as, but not limited to, Lempel-Zip-Markov chain algorithm (LZMA), Burrows-Wheeler algorithm (e.g., bzip2), DEFLATE algorithm (e.g., gzip), machine-learning compression techniques, or any other suitable compression technique.

In some implementations, the quantized data can be stored in associated with the compressed portion of the subject data. For example, storing the two forms of data in association with each other can include storing the two forms of data in a same data file. As another example, storing the two forms of data in association with each other can include storing the two forms of data such that they are logically associated with each other and/or reference each other or each other's storage location. As another example, storing the two forms of data in association with each other can include storing the two forms of data within a data structure, where the data structure contains a logical connection between the two forms of data (e.g., a pointer to the other within a database or look up table).

Figure 6:
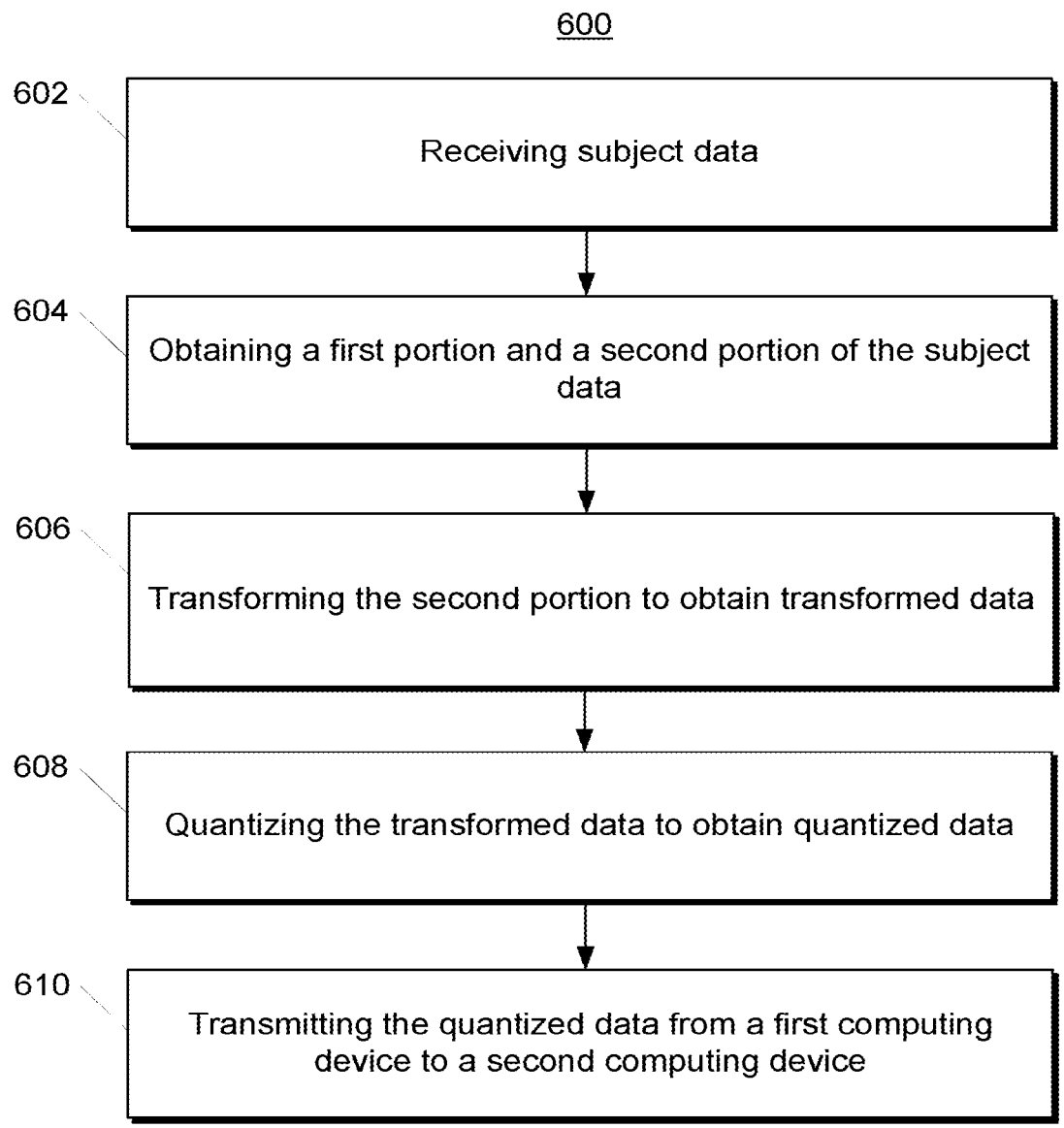
FIG. 6 depicts a flow chart diagram of an example method of transmitting compressed data according to example embodiments of the present disclosure.

FIG. 6 depicts a flow chart diagram of an example method for transmitting compressed data according to example embodiments of the present disclosure. Although FIG. 6 depicts steps performed in a particular order for purposes of illustration and discussion, the methods of the present disclosure are not limited to the particularly illustrated order or arrangement. The various steps of the method 600 can be omitted, rearranged, combined, and/or adapted in various ways without deviating from the scope of the present disclosure.

At 602, a computing system can receive subject data. For instance, the subject data can include a data set. The subject data and/or the data set can include a plurality of data items. For instance, each of the data items can define a value, such as a lexical and/or numerical value. The subject data can be stored according to any suitable format. For example, in some embodiments, the subject data can be floating-point data. In some embodiments, the floating-point data can include a sign component, an exponent component, and/or a mantissa component.

At 604, the computing system can obtain a first portion and a second portion of the subject data. For instance, in some embodiments, the second portion can be an uncompressible portion of the subject data. For instance, the second portion can be a portion of the subject data that may not be effectively compressed according to lossless compression techniques. For instance, the second portion can exhibit limited to no statistical redundancy such that a size of the second portion may not be significantly reduced without information loss. For example, the second portion can include portions of a plurality of data items such that the values of the portions exhibit little to no repetition, especially consecutive repetition, across the plurality of data items.

Additionally and/or alternatively, in some embodiments, the first portion can be a compressible portion of the subject data. The first portion can be effectively compressed according to lossless compression techniques. For instance, the first portion can be effectively compressed without information loss. For example, a size of the first portion can be significantly reduced without information loss. For instance, the first portion can exhibit statistical redundancy such that at least a portion of first portion can be predicted or otherwise recreated based on the statistical redundancy.

At 606, the computing system can transform the second portion to obtain transformed data. For example, the computing system can transform the second portion such that the norm of the second portion is minimized. For example, the computing system can transform the second portion according to a Kashin Decomposition.

At 608, the computing system can quantize the transformed data to obtain quantized data. For instance, the transformed data can be quantized to reduce a precision associated with the transformed data. For example, the quantized data can have a lower number of numerals than the transformed data. Any suitable quantization methods can be employed to quantize the transformed data. For example, the transformed data can be quantized by uniform quantization. As another example, the transformed data can be quantized by truncating at least a portion of the transformed data. For instance, less significant bits can be truncated from the transformed data. As another example, the transformed data can be quantized by mapping the transformed data to one of a plurality of index values.

At 610, the computing system can transmit the quantized data. For instance, the computing system can transmit the quantized data to a second computing system. The quantized data can be transmitted by any suitable method of transmission. For example, the quantized data can be transmitted by wired transmission (e.g., ethernet) and/or by wireless transmission (e.g., Bluetooth, ZigBee, WLAN, IEEE 802.11), or by any other suitable transmission methods or technologies.

Additionally and/or alternatively, the one or more computing devices can transmit a compressed portion of the subject data. For example, the compressed portion can be the first portion of the subject data that is compressed according to any suitable compression technique, especially lossless compression techniques. For example, the compressed portion can be compressed by any suitable compression technique, such as, but not limited to, Lempel-Zip-Markov chain algorithm (LZMA), Burrows-Wheeler algorithm (e.g., bzip2), DEFLATE algorithm (e.g., gzip), machine-learning compression techniques, or any other suitable compression technique. For example, the computing device can compress the first portion to obtain compressed data. Additionally and/or alternatively, the computing device can transmit the compressed data (e.g., to the second computing device). Additionally and/or alternatively, the compressed data can be decompressed (e.g., by the second computing device) to obtain the first portion.

Additional Disclosure

The technology discussed herein makes reference to servers, databases, software applications, and other computer-based systems, as well as actions taken and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A computing system configured to reconstruct data, the computing system comprising:
   one or more processors; and
   one or more non-transitory computer-readable media that store instructions that, when executed by the one or more processors, cause the computing system to perform operations, the operations comprising:
   obtaining compressed data comprising a first portion of subject data;
   obtaining quantized data comprising a second portion of the subject data, wherein the second portion of the subject data remains uncompressed;
   reconstructing the first portion of the subject data from the compressed data; and
   reconstructing the second portion of the subject data from the quantized data.

2. The computing system of claim 1, wherein the subject data comprises floating-point data.

3. The computing system of claim 2, wherein:
   the floating-point data comprises one or more sign bits, a plurality of exponent bits, and a plurality of mantissa bits;
   the first portion of the subject data comprises the one or more sign bits, the plurality of exponent bits, and one or more most significant mantissa bits of the plurality of mantissa bits; and
   the second portion of the subject data comprises one or more least significant mantissa bits of the plurality of mantissa bits.

4. The computing system of claim 2, wherein the floating-point data encodes parameter values for parameters of a machine-learned model.

5. The computing system of claim 1, wherein reconstructing the first portion of the subject data from the compressed data comprises decompressing the compressed data to obtain the first portion of the subject data.

6. The computing system of claim 1, wherein reconstructing the second portion of the subject data from the quantized data comprises reconstructing transformed data from the quantized data.

7. The computing system of claim 6, further comprising reconstructing the second portion of the subject data from the transformed data.

8. The computing system of claim 7, wherein reconstructing the second portion of the subject data from the transformed data comprises applying an inverse transform to the transformed data.

9. The computing system of claim 6, wherein reconstructing the transformed data from the quantized data comprises approximating the transformed data based on the quantized data.

10. The computing system of claim 6, wherein reconstructing the transformed data from the quantized data comprises increasing a precision of the quantized data, wherein the quantized data comprises one or more indices mapped to corresponding values of the transformed data.

11. The computing system of claim 10, wherein increasing the precision of the quantized data comprises appending one or more numerals to the quantized data.

12. A computer-implemented method of reconstructing data, the method comprising:
   obtaining, by one or more computing devices, compressed data comprising a first portion of subject data;
   obtaining, by the one or more computing devices, quantized data comprising a second portion of the subject data, wherein the second portion of the subject data remains uncompressed;
   reconstructing, by the one or more computing devices, the first portion of the subject data from the compressed data; and
   reconstructing, by the one or more computing devices, the second portion of the subject data from the quantized data.

13. The computer-implemented method of claim 12, wherein the subject data comprises floating-point data, and wherein:
   the floating-point data comprises one or more sign bits, a plurality of exponent bits, and a plurality of mantissa bits;

the first portion of the subject data comprises the one or more sign bits, the plurality of exponent bits, and one or more most significant mantissa bits of the plurality of mantissa bits; and the second portion of the subject data comprises one or more least significant mantissa bits of the plurality of mantissa bits.

14. The computer-implemented method of claim 13, wherein the floating-point data encodes parameter values for parameters of a machine-learned model.

15. The computer-implemented method of claim 12, wherein reconstructing, by the one or more computing devices, the first portion of the subject data from the compressed data comprises decompressing the compressed data to obtain the first portion of the subject data.

16. The computer-implemented method of claim 12, wherein reconstructing, by the one or more computing devices, the second portion of the subject data from the quantized data comprises reconstructing transformed data from the quantized data.

17. The computer-implemented method of claim 16, further comprising reconstructing the second portion of the subject data from the transformed data.

18. The computer-implemented method of claim 16, wherein reconstructing the transformed data from the quantized data comprises approximating the transformed data based on the quantized data.

19. The computer-implemented method of claim 16, wherein reconstructing the transformed data from the quantized data comprises increasing a precision of the quantized data, wherein the quantized data comprises one or more indices mapped to corresponding values of the transformed data.

20. One or more non-transitory computer-readable media that store instructions that, when executed by one or more computing devices, cause the one or more computing devices to reconstruct a machine-learned model by performing operations comprising:

obtaining compressed data comprising model parameter data that comprises a plurality of floating-point numbers respectively for a plurality of parameters of the machine-learned model, wherein each of the plurality of floating-point numbers comprises one or more sign bits, a plurality of exponent bits, and one or more most significant mantissa bits of a plurality of mantissa bits;

obtaining quantized data generated by performing uniform quantization on data transformed by performing a Kashin Decomposition on one or more remaining least significant mantissa bits;

reconstructing a first portion of data from the compressed data; and reconstructing a second portion of data from the quantized data.

* * * * *